United States Patent [19]

Kressel et al.

[11] 4,422,161
[45] Dec. 20, 1983

[54] MEMORY ARRAY WITH REDUNDANT ELEMENTS

[75] Inventors: Henry Kressel, Elizabeth; Sheng T. Hsu, Lawrenceville, both of N.J.

[73] Assignee: RCA Corporation, New York, N.Y.

[21] Appl. No.: 309,694

[22] Filed: Oct. 8, 1981

[51] Int. Cl.³ .............................................. G11C 7/00
[52] U.S. Cl. ..................................... 365/200; 365/72; 365/185; 371/10
[58] Field of Search ................. 365/72, 184, 185, 104, 365/200; 371/10

[56] References Cited

U.S. PATENT DOCUMENTS

| | | | |
|---|---|---|---|
| 3,753,235 | 8/1973 | Daughton et al. | 340/172.5 |
| 3,753,244 | 8/1973 | Sumilas | 340/172.5 |
| 3,755,791 | 8/1973 | Arzubi et al. | 365/200 |
| 4,047,163 | 9/1977 | Choate et al. | 340/173 R |
| 4,051,354 | 9/1977 | Choate | 365/200 |
| 4,228,528 | 10/1980 | Cenker et al. | 365/200 |

OTHER PUBLICATIONS

Chin et al., "Reversible On-Chip Redundancy Scheme," IBM Tech. Disc. Bul., vol. 14, No. 10, 3/72, pp. 2983-2984.

Primary Examiner—Stuart N. Hecker
Attorney, Agent, or Firm—Joseph S. Tripoli; Henry I. Schanzer

[57] ABSTRACT

A memory array formed on a single chip is provided with at least one redundant column (or row) of memory cells in addition to "standard" number of columns and rows where the spare column (or row) of cells is designed to be substituted for a standard column (or row) found to have defective cells. Programmable nonvolatile electrically alterable elements are connected to the column (or rows) conductors of the standard and redundant columns (or rows) of cells for selectively disconnecting from the memory circuit a standard column (or rows) containing defective cells and substituting therefor a redundant column (or row) of cells.

8 Claims, 6 Drawing Figures

MEMORY ARRAY WITH REDUNDANT ELEMENTS

This invention relates to semiconductor memories and, in particular, to memories manufactured with redundant cells to improve manufacturing yields.

Large scale integrated (LSI) circuits such as a 64K bit dynamic random access memory (RAM) or a 16K bit static RAM may consist of more than 100,000 active devices. It is difficult to fabricate such large arrays on a single chip without one or more defective devices. If such a large memory array is to be entirely free of defects to be acceptable, the yield in the manufacture of acceptable large memories formed on a single chip would be extremely low. To increase the yield, the prior art teaches the inclusion in a memory array, formed on a single chip, of redundant columns (and/or rows) of cells which can be substituted for columns (and/or rows) containing defective cells. The substitution enables the manufacture of a memory array which is, effectively, free of defective cells at all its operative sites. Some of the known memories which include redundant columns (and/or rows) of cells make use of fusible links which are selectively blown to remove columns containing defective cells. The use of fusible links requires that the redundancy be programmed into the chip at the time the wafer is being manufactured. This cannot be done in the field. To blow a fusible link may require the use of expensive equipment, such as equipment including a laser and/or means for generating relatively high currents. Also, special manufacturing techniques are needed to protect the chip during the blow out of the link. Other memories which teach the use of redundant cells to improve yield require additional circuitry which is space consuming and/or increases the operating cycle time of the memory array.

In a monolithic memory circuit embodying the invention there is included, as in the prior art, at least one spare column (or row) of memory cells in addition to a "standard" number of rows and columns of cells needed to form a basic "standard" memory array. However, in addition, there is included non-volatile electrically alterable elements for selectively removing a "standard" column (or row) of cells containing a defective cell and substituting therefor a spare column (or row) of cells. The non-volatile electrically alterable elements enable redundancy to be programmed at any time after the chip is manufactured. This is in sharp contrast to those memory chips which include fusible links. The use of non-volatile electrically alterable elements eliminates the need for expensive equipment and/or the need for special fabrication of the chip to withstand large currents. In brief, the use of non volatile electrically alterable elements provide flexibility and ease of programming to substitute redundant cells for defective ones.

In the accompany drawing like reference characters denote like components; and

Figure 3A:
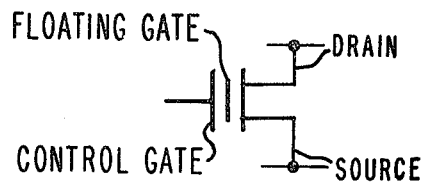
Figure 3B:
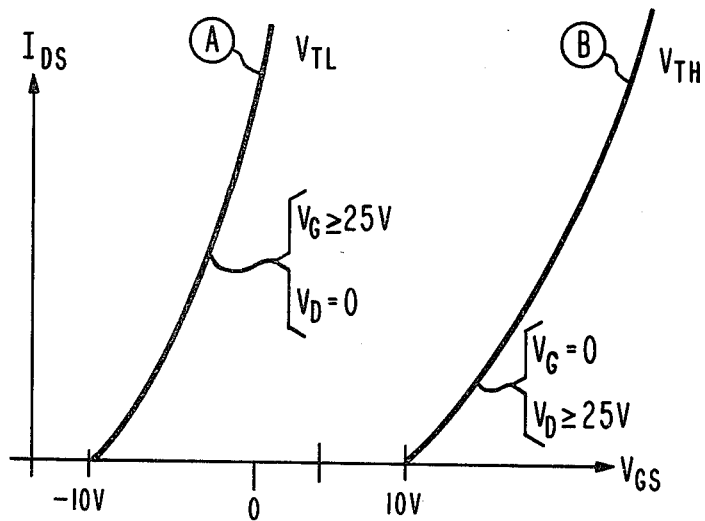
Figure 3C:
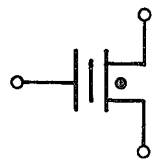
Figure 4:
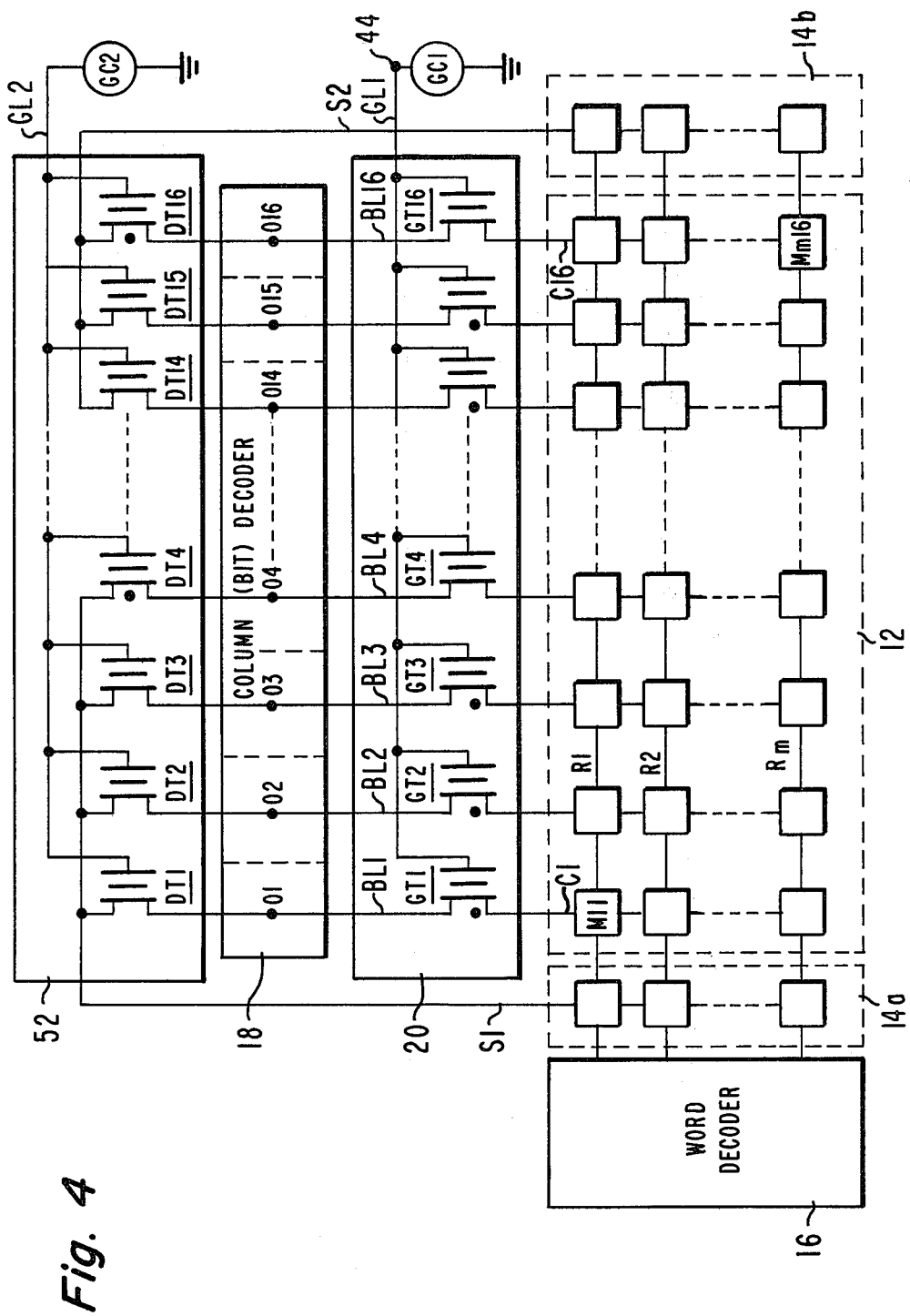

FIGS. 3A, 3B and 3C are, respectively, the schematic representation of a Gate-Injected Metal-Oxide Semiconductor (GIMOS) transistor which may be used to practice the invention, the current voltage characteristics of the GIMOS transistor for two different values of threshold voltage ($V_{TL}$ and $V_{TH}$), and the schematic representation of a GIMOS transistor set to the low threshold ($V_{TL}$) condition; and FIG. 4 is a schematic diagram of another RAM embodying the invention.

Figure 1:
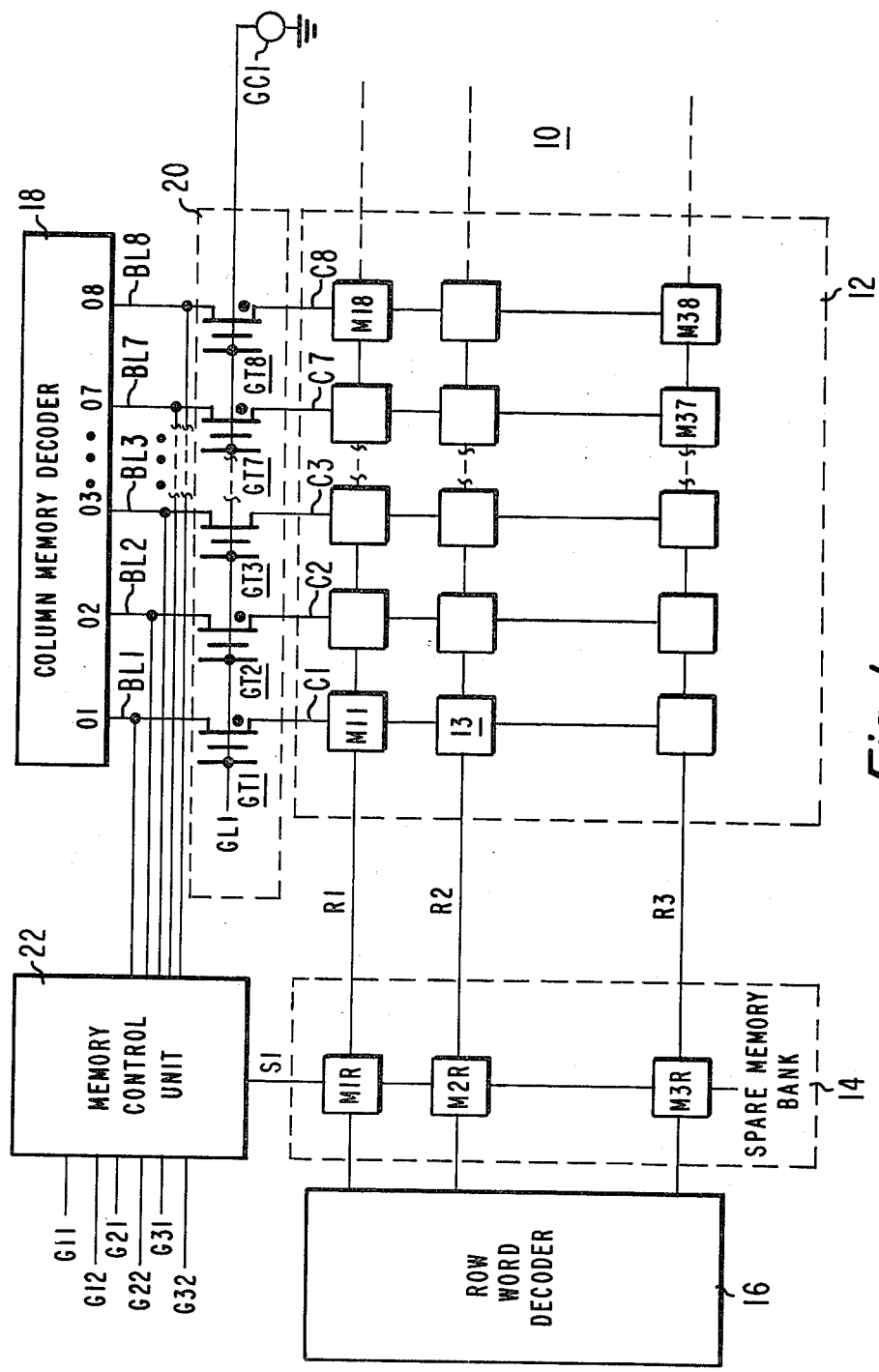
FIG. 1 is a diagram, partially in schematic and partially in block form, of a random access memory (RAM) circuit embodying the invention.

The circuit of FIG. 1 includes an integrated circuit (IC) memory chip 10 comprised of: (1) a standard array 12 of memory cells, Mij, arranged in "i" rows and "j" columns where i and j are integers representing the order of the rows and columns, respectively; (2) a spare memory bank 14 including, by way of example, a redundant column of cells MiR; (3) a row decoder 16 whose outputs are coupled to and drive the row conductors associated with array 12 and the redundant column; (4) a column decoder 18 whose outputs are connected to bit lines (BLj); (5) a gating network 20, comprised of non-volatile, electrically alterable elements, coupled between the bit lines (BLj) and respective column conductors (Cj) of array 12; and (6) a memory control unit 22 for selectively coupling one of the bit lines to the redundant column.

Array 12 is shown, for ease of description, as having only 3 rows and 5 (of 8) columns of memory cells, Mij, which may be either dynamic or static. There is a row conductor (Ri) per row of cells and a column conductor (Cj) per column of cells. The row conductors function as the word lines while the column conductors function as the bit lines. Only a single column conductor line is shown per column of cells but it should be understood that the line could include two bit lines for carrying complementary information to or from a column of cells. Memory arrays of the type under consideration are known in the art and parts of arrays are shown, for example in the following U.S. Pat. Nos. 4,156,940 and 4,189,782 (Array of 5 Transistor Static Memory Cells); 4,107,556 (Array of 1 Transistor Dynamic Memory Cells); and 3,714,638 (Array of 6 Transistor Static Memory Cells). The structure and operation of memory arrays shown in the cited references and others well known in the art is incorporated herein by reference. The read and write operation of memory arrays is known and need not be greatly detailed. Suffice it to say that when an enabling signal is applied to a row conductor (Ri) all the cells (Cij) of that row are accessed. Information (a "high" or a "low") on a column conductor (Cj) can then be written into the cell (Mij) associated with that row and column or else information in an accessed cell can then be read out onto the column conductor (Cj) associated with the cell.

For ease of description, the redundant memory bank is shown comprised of a single column of cells MiR, each of which is, preferably, similar to the Mij cells of array 12. Each row of the redundant column corresponds to a like row of array 12 and is accessed by a corresponding row conductor. The column conductor (bit line) for the redundant column is designated as S1.

Word decoder 16, may be any one of a number of known decoders having one output per row conductor, each output being connected to its corresponding row (word line) conductor. Decoder 16 is responsive to a set of input signals (not shown) for selectively producing an enabling signal at one or more of its outputs and a disabling signal at its remaining outputs.

Column decoder 18 may also be any one of a number of known decoders responsive to a set of input signals (not shown). The outputs (Oj) of decoder 18 are connected to respective bit lines (BLj), there being one output, Oj, and one bit line, BLj, per column conductor, Cj. Decoder 18 may be programmed to apply a "high" ($V_{DD}$ volts or logic "1") to a selected one or ones of the bit lines or a "low" ($V_{SS}$ volts or logic "0") to the remaining bit lines.

The elements used to form gating network 20 and memory control unit 22 are Gate-Injected Metal-Oxide Semiconductor (GIMOS) field-effect transistors. These devices are known and are described, for example, in copending application Ser. No. 946,722, filed on Sept. 28, 1978, titled ELECTRICALLY PROGRAMMABLE FLOATING GATE READ ONLY MEMORY DEVICE AND METHOD FOR MAKING SAME refiled as application Ser. No. 180,902 on Aug. 25, 1980 and application Ser. No. 181,662 on Aug. 26, 1980, assigned to the assignee of the present application, and the subject matter of which is incorporated herein by reference.

Figure 2:
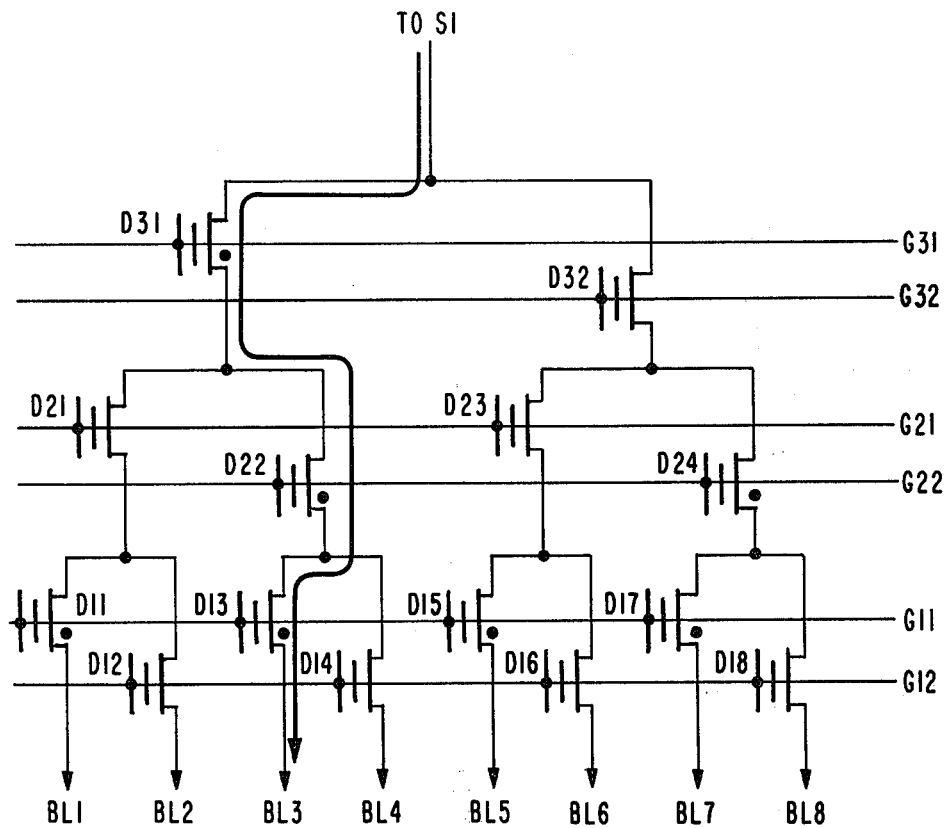
FIG. 2 is a schematic diagram of a tree decoder suitable for use in the circuit of FIG. 1.
Figure 2:
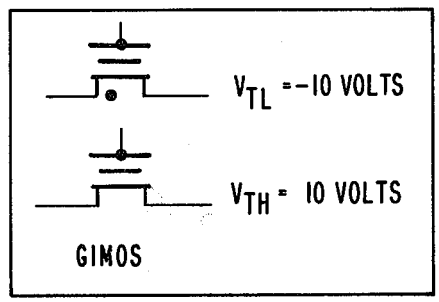

For ease of the description to follow, the symbol for a GIMOS is shown in FIG. 3A. The GIMOS has a floating gate, a control electrode (control gate), and source and drain electrodes defining the ends of its conduction path within a substrate. The GIMOS transistors used in the circuit of FIGS. 1 and 2 are of N-conductivity type and the current-voltage ($I_{DS}$ versus $V_{GS}$) characteristic of the N-type GIMOS for two different values of threshold voltage is shown in FIG. 3B. When a voltage (e.g. +25 volts) is applied to the control gate electrode of the GIMOS which is more positive than the drain voltage (e.g. 0 volts) by some minimum voltage (which in this application is assumed to be 15 volts) holes are injected from the control gate onto the floating gate reducing the gate voltage necessary to turn on the N-channel device. The GIMOS is then set to its low threshold voltage ($V_{TL}$) condition—Curve A in FIG. 3B. $V_{TL}$ is assumed equal to $-10$ volts at low values of drain-source current. In this application elements set to $V_{TL}$ are identified with a dot as shown in FIG. 3C.

When a voltage (e.g. 0 volt) is applied to the gate electrode of the GIMOS which is more negative than the drain voltage (e.g. 25 volts) by more than some minimum value (which in this application is also assumed to be 15 volts) electrons are injected from the control gate onto the floating gate increasing the gate voltage necessary to turn it on. The GIMOS is then set to its high threshold voltage ($V_{TH}$) condition, shown in Curve B of FIG. 3B. $V_{TH}$ is assumed equal to $+10$ volts at low values of drain-source current.

A voltage applied between the gate and drain, regardless of polarity, which is less than 15 volts will have no effect on the condition of the GIMOS.

The GIMOS is a non-volatile device capable of sustaining tens of thousands of write/erase (W/E) cycles. The digital information stored in a GIMOS can be read out at least $10^{12}$ times without any change in threshold voltage. Therefore, a GIMOS is an ideal device for use as non-volatile Electrically Alterable Programmable Element. Although GIMOS devices are used in the present application, any electrically alterable nonvolatile devices (e.g. floating gate devices and non-volatile memory elements such as Metal Nitride Oxide Semiconductor (MNOS) devices) could be used instead.

Returning to FIG. 1, gating circuit 20 includes a GIMOS gating transistor GTj per bit line BLj and column conductor Cj. Each gating transistor GTj has a conduction path connected between its corresponding bit line BLj and column conductor Cj. The gate electrodes of all the GTj's are connected to a common gate control line GL1 which is driven by a signal source GC1.

Memory control unit 22 is used to substitute column S1 for any column containing one or more defective cells. The memory control unit, as shown in FIG. 2, is a tree decoder comprised of GIMOS devices arranged to perform 3 levels of decoding to enable the selection of any one of eight paths between 8 bit lines and S1. Each bit line can be connected to S1 via a unique path comprised of the conduction paths of 3 series connected GIMOS decoding transistors. The decoding GIMOS transistors (Dpg) are identified by the letter D followed by two numerals where the first numeral (p) represents the decoding level of the transistor and the second numeral (q) the number of the transistor on the level. Six (6) control lines (G11, G12, G21, G22, G31, G32), two per decoding level, are provided for controlling the setting of the GIMOS decoding transistors.

The operation of the memory system is now discussed.

Following fabrication of the memory array, but prior to testing it, the GIMOS transmission gate transistors (GTj's) are written to their low threshold voltage ($V_{TL}$) condition. To write the GTj's to their $V_{TL}$ condition, a potential of +25 volts is applied to control line GL1. This causes holes to be injected from the control gate through the oxide and to be trapped at the floating gate of every GTj. Hence, the threshold voltage ($V_T$) of all the GTj's is set to $V_{TL}$, which is equal to $-10$ volts. This causes the GTj's to function as depletion type transistors and to be rendered conducting until (and unless) a reverse bias of 10 volts or more is applied between the gate and source electrode of the GTj's. Thus, initially, in the operation of the system all the GTj's are set to $V_{TL}$. Concurrently, all the decoding GIMOS transistors (Dpq) in memory control unit 22 are written to their high threshold voltage ($V_{TH}$) state. Consequently, memory control unit 22 is essentially out of the circuit while all the GTj transistors, which are operating as depletion type transistors, are turned-on hard and provide a low impedance path between each column Cj and its respective bit line BLj which is connected to decoder 18. The standard memory array 12 is then tested by selectively enabling the row and column conductors. If, in the course of testing array 12, it is discovered that one of the elements in any one of the columns (e.g. C3) is defective, that column is taken out of operation and a column from memory bank 14 is substituted therefor as now discussed.

It will be assumed, for example, that column 3 is found to include one or more defective elements and is to be removed from the circuit. Its removal is achieved by switching element GT3 from its $V_{TL}$ condition to its $V_{TH}$ condition thereby effectively disconnecting C3 from BL3. To set GT3 to $V_{TH}$, BL3 is addressed by means of column decoder 18 which applies a potential of $+V_{DD}$ volts to BL3. Concurrently, decoder 18 applies a potential of $V_{SS}$ volts, which for the purpose of this example is assumed to be ground, to the bit lines other than BL3. Then, a potential of $-V_{GG}$ volts is applied to gate line GL1. This causes a potential of $[V_{DD}+V_{GG}]$ volts to be developed between the source/drain of GT3 and its gate electrode. It is assumed that the sum of $[V_{DD}+V_{GG}]$ is larger than the minimum write voltage of the GIMOS. Assume that the minimum write voltage is 15 volts, that $V_{GG}$, which may be assumed to be 15 volts, is somewhat less than the minimum write voltage, but that the sum of $[V_{DD}+V_{GG}]$ volts is equal to or exceeds 25 volts. The $[V_{DD}+V_{GG}]$ gate-to-source voltage causes electrons to be injected from the control electrode of GT3 and to be trapped at the floating gate of GT3. GT3 is then set to $V_{TH}$ which is assumed to be +10 volts. Henceforth, to turn-on GT3 a $V_{GS}$ equal to at least +10 volts must be applied between its gate and source. In the absence of this +10 volt turn-on voltage, GT3 is turned-off and appears as an extremely high impedance device effectively disconnecting C3 from BL3. The remaining non-selected GTj's with ground applied to one of their source and drain electrodes and $-V_{GG}$ (e.g. 15 volts) applied to their control electrodes remain unchanged in their $V_{TL}$ state. Hence, the GTj's other than GT3 function as depletion type transistors coupling the BLj's other than BL3 to their corresponding column conductors via a very low impedance path. Thus, GT3 requires the application of a positive voltage of 10 volts, or more, to its gate in order to conduct while the other $G_{Tj}$ transistors are turned-on and remain turned-on until a negative voltage in excess of $(-)10$ volts is applied to their gate electrodes. Therefore, with the voltage on line GL1 anywhere between $-10$ volts and $-10$ volts, column 3 will be disconnected from BL3 while the remaining columns will be tightly coupled to their corresponding bit lines. For ease of operation GL1 would normally be returned to ground potential when not being used to set a GTj to $V_{TL}$ or $V_{TH}$.

The selection of spare column S1 to replace a defective column (e.g. C3) is best explained with reference to FIG. 2. Recall that initially all the decoding GIMOS transistors Dpq in the memory control unit 22 were set to $V_{TH}$ assumed to be $-10$ volts.

Assume, by way of example, that BL3 is now to be coupled to S1 via a low impedance conduction path. An examination of FIG. 2 reveals that this requires that transistors D31, D22 and D13 be turned-on or set to their $V_{TL}$ condition. To establish the desired path a positive potential of +25 volts is applied to control lines G11, G22 and G31.

Transistors D31, D22, and D13 are then set to $V_{TL}$ and provide a low impedance conduction path between S1 and BL3. Concurrently, transistors D24, D11, D15 and D17 are also set to $V_{TL}$. However, there is no low impedance conduction path between S1 and a bit line other than the one between S1 and BL3.

Following the writing of D31, D22, and D13 to the $V_{TL}$ condition, the control lines G11 through G32 are returned to ground. This ensures that all the non-selected transistors remain at $V_{TH}$.

Due to the stable non-volatile nature of the GIMOS transistors, the memory system now functions with column S1 replacing column 3. The memory bank has been shown with but one spare column. It should be evident that more than one column could be fabricated and selectively substituted for a "standard" column of array 12.

The circuit of FIG. 4 presents an example of a very simple control circuit for substituting a spare column for a defective column of a standard RAM array.

The circuit of FIG. 4 like that of FIG. 1 includes an array 12 of memory cells (Mij), a word decoder 16 to which are connected all the (word) row lines, a bit decoder 18 arranged to provide j outputs (Oj) and to whose outputs (Oj) are connected bit lines, BLj, and a transmission gate network 20 for coupling the bit lines (BLj) to their respectively column conductors Cj. The circuit of FIG. 4 includes two spare columns 14a and 14b and a second transmission gate network 52 for selectively substituting a spare column for a defective column of the standard array. Gating network 52 includes one GIMOS transistor per bit line denoted by the letters DT followed by a reference numeral.

The conduction paths of transistors DT1 through DT4 are connected between their respective bit lines (BL1 through BL4) and a column conductor S1 which is associated with redundant column 14a. The conduction paths of transistors DT14 through DT16 are shown connected between their respective bit lines and a column conductor S2 which is associated with the redundant column 14b. The gate electrodes of the DTj transistors are connected in common to a control line GL2 which is driven by a control source GC2.

In a similar manner to that described for the system of FIG. 1, following fabrication of the array of the GTj transistors are placed in their $V_{TL}$ state insuring their high conductivity and tight coupling of the BLj lines to the Cj column conductors. Concurrently, the DTj transistors are placed in their $V_{TH}$ state and a potential is applied to GL2 to ensure that they remain turned-off. The memory array 12 is then tested by programming the word and column decoders through any desired cycle. If in the course of testing the array it is found, for example, that columns 4 and 16 contain defective elements column 14a will be substituted for column 4 and column 14b will be substituted for column 16.

This is achieved by setting GT4 and GT16 to $V_{TH}$ while maintaining the remaining GTj transistors in their $V_{TL}$ state. This ensures that column conductors C4 and C16 are effectively disconnected from their respective bit lines BL4 and BL16. Then DT4 and D16 are set to $V_{TL}$ while the remaining DTj transistors are maintained in their $V_{TH}$ condition. Consequently, DT4 and DT16 provide low impedance conduction paths between BL4 and S1 and between BL16 and S2, respectively. Thus, column 14a is substituted for column 4 and column 14b is substituted for column 16.

The need for two control lines GL1 and G12 and two voltage control sources GL1 and GL2 may be further simplified by, for example, making all the DTj transistors of P conductivity type. This enables GL1 to be short circuited to GL2 and requires but a single driving source (e.g. GC1). Therefore, assume now that the DTj transistors are of P conductivity type, that GL2 is common to GL1 and that GC2 is identical to GL1.

Since the DT1 and GTj transistors function as transmission gates their construction should be such that the sources of the N and P channel GIMOS devices should not be connected to the substrate or wells. An advantage of the complementary configuration is that the gate electrodes of all the GIMOS devices may be connected to a common probe pad 44 for repair programming. Pad 44 would not need to be connected to any package pin.

Following fabrication of the memory and prior to testing of the array, a large positive voltage pulse of let us say approximately 25 volts is applied to pad 44 and therefore to all the gate electrode to all the GIMOS transistors. The application of 25 volts to node 44 ensures that all the N channel GIMOS devices, that is all the GTj transistors are set to a $V_{TL}$ of approximately $-10$ volts. This ensures that these transistors function as depletion transistors and are always conducting. The application of the same 25 volts to pad 44 ensures that all the P channel DTj transistors are set to their $V_{TH}$, state which is assumed equal to +10 volts. Following the setting of the GTj and DTj transistors, the memory decoders are exercised and the memory array 12 is tested. If any column is found to contain a defective cell the N channel GTj transistor of the j column will be written to the high threshold voltage state (i.e. a $V_{TH}$ of +10 volts) and the associated P channel DTj transistor will be written to the low threshold voltage state (i.e. $V_{TL}$ of −10 volts) replacing a "standard" column by a spare memory column. Assume as before that columns 4 and 16 are to be replaced by redundant columns 14a and 14b, respectively. The actual disconnecting of column conductor C4 and C16 from bit line BL4 and BL16 and the connection of BL4 and BL16 to S1 or S2 is accomplished as follows. Column decoder 18 is programmed to apply a signal of $V_{DD}$ volts to its output 04 and 06. Thus, the source/drain of GT4 and GT16 are at $V_{DD}$ volts while the sources and drains of the other GTj transistors are at ground potential. A negative pulse of $V_{GG}$ volts in amplitude is then applied to pad 44 which is common to the gate electrode of all the transistors. The amplitude of $V_{GG}$ is chosen to be smaller than the minimum write voltage of the GIMOS transistors. But, the sum of $V_{GG}+V_{DD}$ is larger than the minimum write voltage. Therefore, the application of $V_{GG}$ causes transistors GT4 and GT16 to be written to a $V_{TH}$ of +10 volts while DT4 and DT16 are concurrently written to their $V_{TL}$ state of −10 volts. The threshold voltage of the transistor other than GT4 and GT16 remains unchanged. DT4 and DT16 function as very low impedance conduction paths connecting BL4 to line S1 and BL16 to line S2, respectively.

The spare columns 14a and 14b now replace columns 4 and 16. Whenever column 4 and 16 are selected, for read or write or refresh, the substituted spare column will provide the needed information or store the information substituted being written.

The redundant circuitry increases the chip size very little. In addition to the redundant columns of cells there is added only two transmission gate transistors per column.

The invention has been shown with the addition of "spare" columns. This was done by way of example only. It should be evident that instead of, or in addition to, spare columns "spare" row can be added to a memory array. Also, the invention has been illustrated with RAMs. It should be evident that the invention can be practiced with any memory array, RAM, or any variety of read only memory (ROM) such as, for example, an electrically erasable programmable ROM, or electrically programmable ROM.

In the claims appended hereto reference is made to row and column conductors, but is should be evident that the terms can be used interchangeably without departing from the invention.

What is claimed is:

1. In a memory array formed on a semiconductor chip comprising memory cells arranged in rows and columns, some of the columns being "standard" columns and at least one of the columns being initially a "spare" to be substituted for a "standard" column which includes a defective cell, and including a decoder for selectively energizing selected ones of said columns, the improvement comprising:
   a plurality of programmable non-voltatile electrically alterable elements, each one of said elements having a main conduction path and a control electrode;
   a first set of said programmable non-voltatile electrically alterable elements having their main conduction paths connected between the "standard" columns and respective decoder outputs for providing a low impedance conduction path between respective decoder outputs and those standard columns having no defective elements and for effectively disconnecting the decoder output from a standard column containing a defective element; and
   a second set of said programmable non-volatile electrically alterable elements having their main conduction paths connected between the decoder and a spare column for substituting said at least one spare column for said standard column containing a defective element by providing a low impedance path between the spare column and a decoder output effectively disconnected from a standard column containing a defective element.

2. A monolithic integrated circuit comprising:
   a standard memory array of cells arranged in rows and columns, with a row conductor per row of cells and a column conductor per column of cells;
   a row decoder and a column decoder;
   means coupling the row decoder to the row conductors;
   a plurality of programmable non-volatile electrically alterable elements, each one of said elements having a main conduction path and a control electrode;
   a first set of said non-volatile electrically alterable elements having their main conduction paths connected between the column decoder and the column conductors;
   a spare column of cells having the same number of rows as said standard array; and
   a second set of said non-volatile electrically alterable elements having their main conduction paths connected between said column decoder and said spare column.

3. The combination as claimed in claim 2 wherein said first set of non-volatile electrically alterable elements includes transistors having their conduction paths connected between the column decoder and the column conductors.

4. The combination as claimed in claim 3 wherein said second set of non-volatile electrically alterable elements includes transistors having their conduction paths connected between said spare column and selected outputs of said column decoder.

5. The combination as claimed in claim 3 wherein said non-volatile electrically alteralble elements are gate injected metal oxide semiconductor transistors.

6. The combination as claimed in claim 2 wherein said memory array is a Random Access Memory.

7. The combination as claimed in claim 2 wherein said second set includes a decoding arrangement for selecting a unique path between one of said column decoder outputs and said spare column.

8. A monolithic integrated memory circuit comprising:
   a standard array of memory cells arranged in X lines and Y lines generally perpendicular to the X lines, the cells in each X line sharing an X conductor, and the cells in each Y line sharing a Y conductor;
   an X decoder having an output per X conductor;
   means connecting each X conductor to its corresponding X decoder output;
   a Y decoder having an output per Y conductor;
   a spare line of X cells; and
   non-volatile electrically alterable transistors having their main conduction paths directly connected between the Y conductors and their corresponding Y decoder outputs and between said spare line and said Y decoder for:
(a) providing a low impedance path between all Y conductors with which there are associated no defective cells;
(b) effectively disconnecting from the Y decoder Y conductors with which there are associated defective cells; and
(c) providing a low impedance path between a decoder output effectively disconnected from a Y conductor and said spare line.

* * * * *

UNITED STATES PATENT AND TRADEMARK OFFICE
CERTIFICATE OF CORRECTION

PATENT NO. : 4,422,161

DATED : December 20, 1983

INVENTOR(S) : Henry Kressel et al.

It is certified that error appears in the above-identified patent and that said Letters Patent is hereby corrected as shown below:

Col. 4, line 12, change "Dpg" to - - - Dpq - - -.

Col. 5, line 23, change "-10" (second occurrence) to - - - +10 - - -.

Col. 5, line 33, change "-10" to - - - +10 - - -.

Col. 7, line 43, change "row" to - - - rows - - -.

Col. 8, line 13, change "impendance" to - - - impedance - - -.

Col. 8, line 48, change "alteralble" to - - - alterable - - -.

Signed and Sealed this

Twenty-fourth Day of April 1984

[SEAL]

Attest:

GERALD J. MOSSINGHOFF

Attesting Officer    Commissioner of Patents and Trademarks